United States Patent
Shen et al.

(10) Patent No.: US 9,344,082 B2
(45) Date of Patent: May 17, 2016

(54) RAPID CUTOFF DEVICE AND OPERATION METHOD FOR SCR DC SWITCHES

(71) Applicant: Ablerex Electronics Co., Ltd., New Taipei (TW)

(72) Inventors: Jia-Min Shen, Kaohsiung (TW); Yi-Hao Chang, Kaohsiung (TW); Chia-Hung Lee, Kaohsiung (TW)

(73) Assignee: Ablerex Electronics Co., Ltd., New Taipei (TW)

( * ) Notice: Subject to any disclaimer, the term of this patent is extended or adjusted under 35 U.S.C. 154(b) by 0 days.

(21) Appl. No.: 14/587,274

(22) Filed: Dec. 31, 2014

(65) Prior Publication Data

US 2016/0056820 A1  Feb. 25, 2016

(30) Foreign Application Priority Data

Aug. 25, 2014 (TW) .............................. 103129204 A

(51) Int. Cl.
*H03K 17/73* (2006.01)

(52) U.S. Cl.
CPC ..................................... *H03K 17/73* (2013.01)

(58) Field of Classification Search
None
See application file for complete search history.

(56) References Cited

U.S. PATENT DOCUMENTS

| | | | | |
|---|---|---|---|---|
| 3,967,138 A | * | 6/1976 | Mitsuoka | H03K 17/79 327/465 |
| 5,850,160 A | * | 12/1998 | Schnetzka | H02M 7/155 327/453 |
| 7,079,363 B2 | | 7/2006 | Chung | |
| 8,890,371 B2 | | 11/2014 | Gotou | |

* cited by examiner

*Primary Examiner* — Long Nguyen
(74) *Attorney, Agent, or Firm* — Alan D. Kamrath; Kamrath IP Lawfirm, P.A.

(57) ABSTRACT

A rapid cutoff device includes a thyristor DC switch, a switch and a capacitor. An operation method includes: connecting the thyristor DC switch between a first DC circuit and a second DC circuit; serially connecting the switch and the capacitor which further parallel connects the first DC circuit; when the thyristor DC switch is conducted, supplying a DC current via the thyristor DC switch; when a drive signal of the thyristor DC switch stops, operating the switch to conduct the capacitor which is charged by the first DC circuit to rapidly lower a current of the thyristor DC switch approaching a zero value, thereby rapidly cutting of the thyristor DC switch.

24 Claims, 2 Drawing Sheets

RAPID CUTOFF DEVICE AND OPERATION METHOD FOR SCR DC SWITCHES

BACKGROUND OF THE INVENTION

1. Field of the Invention

The present invention relates to a rapid cutoff device and operation method for SCR DC switches. More particularly, the present invention relates to a one-way or bi-directional rapid cutoff device and operation method for SCR DC switches.

2. Description of the Related Art

Generally, switch elements mainly include active switch elements and mechanical switch elements. However, when the mechanical switch element is applied in an AC circuit, there is a need of providing adequate capabilities of switching off and eliminating electric arc. If the mechanical switch element is applied in a DC circuit, there is a need of providing a high degree of electric arc elimination capability due to no phase shift current occurred in the DC circuit. Hence, the conventional mechanical switch elements result in an increase of manufacturing cost and dimensions.

In addition, in switching-off operation, the mechanical switch element will generate electric arc which will damage the contact points and reduce the useful life. In order to avoid the aforesaid drawbacks, the active switch elements have replaced the mechanical switch elements. MOSFETs (Metal-Oxide-Semiconductor Field-Effect Transistors) and IGBTs (Insulated Gate Bipolar Transistors) of the active switch elements are generally applied to provide a function of hard switching. In switching-off operation, the active switch element, however, applied in both of the AC circuit and the DC circuit can effectively and rapidly cut off the current therein and further has an advantage of resulting in no electric arc. Even though the active switch element has the advantage of rapidly switching, it also has characteristics of low endurability of voltages and currents and cannot endure transient, rapid and bulk currents. Accordingly, the active switch element has a drawback of low reliability.

Furthermore, thyristor switch elements are excellent high-power elements which have the advantage of high voltage and inrush current endurabilities. The thyristor switch elements further have several advantages of a wider range of applications, longer useful life, higher reliability, rapid operation, minimized dimensions, easy and economic maintenance, lower power consumption, low manufacture cost and uneasy burn-out. However, when the thyristor switch element is applied in the AC circuit, a current of the thyristor switch element requires gradually decreasing and approaching a zero value to completely cut off it after stopping a drive signal. Further, when the thyristor switch element is applied in the DC circuit, there continuously exists a current in the thyristor switch element such that it cannot completely cut off due to no phase shift current occurred in the DC circuit. Accordingly, the thyristor switch element cannot be completely cut off by the current thereof even though stopping a drive signal.

By way of example, U.S. Pat. Application No. 20120086427, entitled "Alternating Current/Direct Current Two-way Switch," corresponding to Taiwanese Pat. Publication No. 201106623, discloses an AC/DC two-way switch. The AC/DC two-way switch connects between an AC power source or a DC power source and a load to control a power supply to the load. The AC/DC two-way switch includes: a bi-directional semiconductor switch element having a transistor structure connected in series between a power source and the load; a rectifying unit connected in parallel between the first input terminal and a second input terminal; a power source unit for converting an output voltage from the rectifying unit into a stable voltage; and a controller for controlling an entire operation of the AC/DC two-way switch. The AC/DC two-way switch further includes a driving unit for turning on the bi-directional semiconductor switch element in response to a control signal.

However, the above AC/DC two-way switch applied in a DC power distribution system can avoid occurrence of electric arc in switching on and off operation. The above-mentioned publication is incorporated herein by reference for purposes including, but not limited to, indicating the background of the present invention and illustrating the situation of the art.

Another U.S. Pat. No. 7,079,363, entitled "Hybrid DC Electromagnetic contactor," discloses a hybrid DC electromagnetic contactor. The hybrid DC electromagnetic contactor includes: a power unit for supplying a certain power voltage; a main contact point of a breaking switch for providing a supply path of the power voltage by being switched in accordance with a voltage apply to an operational coil; a switch for providing a supply path of the power voltage according to a gate signal; a snubber circuit for charging voltage at the both ends of the switch in turning off of the switch and being applied-discharged an electric current when the charged voltage is not less than a certain voltage; and a discharge current removing unit for removing the discharge current by providing a discharge current path to a load block in turning off of the switch, it is possible to minimize a size of leakage current when the main contact point and the semiconductor switch are turned off.

However, the hybrid DC electromagnetic contactor provides the semiconductor switch parallel connected with the mechanical contact switch such that it can avoid occurrence of electric arc in switching on and off operation. The above-mentioned patent is incorporated herein by reference for purposes including, but not limited to, indicating the background of the present invention and illustrating the situation of the art.

As is described in greater detail below, the present invention provides a rapid cutoff device and operation method for SCR DC switches. A thyristor DC switch electrically connects with a first DC circuit. When a drive signal of the thyristor DC switch stops, a switch is operated to conduct a capacitor. The capacitor is charged by the first DC circuit to rapidly lower a current of the thyristor DC switch for approaching a zero value, thereby rapidly cutting off the thyristor DC switch. Advantageously, the present invention can accomplish rapidly cutting off the thyristor DC switch with respect to the conventional DC mechanical switch element.

SUMMARY OF THE INVENTION

The primary objective of this invention is to provide a rapid cutoff device and operation method for SCR DC switches. A thyristor DC switch electrically connects with a first DC circuit. When a drive signal of the thyristor DC switch stops, a switch is operated to conduct a capacitor. The capacitor is charged by the first DC circuit to rapidly lower a current of the thyristor DC switch for approaching a zero value, thereby rapidly cutting off the thyristor DC switch. Advantageously, the rapid cutoff device of the present invention is successful in rapidly cutting off the thyristor DC switch.

The rapid cutoff device for SCR DC switches in accordance with an aspect of the present invention includes:

a thyristor DC switch connected between a first DC circuit and a second DC circuit, with conducting the thyristor DC switch to supply DC power via the thyristor DC switch;

a switch; and a capacitor serially connected with the switch, with the switch and the capacitor parallel-connected with the first DC circuit;

wherein when a drive signal of the thyristor DC switch stops, the switch is operated to conduct the capacitor and the capacitor is charged by the first DC circuit which cannot supply the DC power via the thyristor DC switch to rapidly lower a current of the thyristor DC switch for approaching a zero value, thereby rapidly cutting off the thyristor DC switch.

In a separate aspect of the present invention, the thyristor DC switch has a second DC circuit end parallel-connected to a reversely-connected diode.

In a further separate aspect of the present invention, the capacitor further includes a discharge circuit including a resistor and a discharge switch serially connected thereto.

In yet a further separate aspect of the present invention, the thyristor DC switch is a one-way thyristor DC switch or a bidirectional thyristor switch.

The rapid cutoff device for SCR DC switches in accordance with another aspect of the present invention includes:

a bidirectional thyristor switch connected between a first DC circuit and a second DC circuit, with conducting a first direction of the bidirectional thyristor switch to supply first DC power of the first DC circuit to the second DC circuit via the bidirectional thyristor switch, with alternatively conducting a second direction of the bidirectional thyristor switch to supply second DC power of the second DC circuit to the first DC circuit via the bidirectional thyristor switch;

a first switch;

a first capacitor serially connected with the first switch, with the first switch and the first capacitor parallel-connected with the first DC circuit;

a second switch; and a second capacitor serially connected with the second switch, with the second switch and the second capacitor parallel-connected with the second DC circuit;

wherein when a first drive signal of the bidirectional thyristor switch stops, the first switch is operated to conduct the first capacitor and the first capacitor is charged by the first DC circuit which cannot supply the first DC power to the second DC circuit via the bidirectional thyristor switch to rapidly lower a first current of the bidirectional thyristor switch for approaching a zero value, thereby rapidly cutting off the bidirectional thyristor switch;

or, wherein when a second drive signal of the bidirectional thyristor switch stops, the second switch is operated to conduct the second capacitor and the second capacitor is charged by the second DC circuit which cannot supply the second DC power to the first DC circuit via the bidirectional thyristor switch to rapidly lower a second current of the bidirectional thyristor switch for approaching a zero value, thereby rapidly cutting off the bidirectional thyristor switch.

In a separate aspect of the present invention, the bidirectional thyristor switch further includes a first reversely-connected diode parallel-connected with the second DC circuit.

In a further separate aspect of the present invention, the bidirectional thyristor switch further includes a second reversely-connected diode parallel-connected with the first DC circuit.

In yet a further separate aspect of the present invention, the first capacitor parallel-connects with a first discharge circuit including a first resistor and a first discharge switch serially connected thereto.

In yet a further separate aspect of the present invention, the second capacitor parallel-connects with a second discharge circuit including a second resistor and a second discharge switch serially connected thereto.

In yet a further separate aspect of the present invention, the bidirectional thyristor switch further includes a mechanical switch parallel-connected therewith to form a hybrid switch.

In yet a further separate aspect of the present invention, a mechanical switch connects between the bidirectional thyristor switch and the second DC circuit to form an isolation switch.

The operation method of the rapid cutoff device for SCR DC switches in accordance with an aspect of the present invention includes:

connecting a thyristor DC switch between a first DC circuit and a second DC circuit;

serially connecting a switch with a capacitor, and further parallel-connecting the switch and the capacitor with the first DC circuit;

supplying DC power of the first DC circuit via the thyristor DC switch while switching on the thyristor DC switch;

wherein when a drive signal of the thyristor DC switch stops, the switch is operated to conduct the capacitor and the capacitor is charged by the first DC circuit which cannot supply the DC power via the thyristor DC switch to rapidly lower a current of the thyristor DC switch for approaching a zero value, thereby rapidly cutting off the thyristor DC switch.

In a separate aspect of the present invention, the thyristor DC switch has a second DC circuit end parallel-connected to a reversely-connected diode.

In a further separate aspect of the present invention, the capacitor further includes a discharge circuit including a resistor and a discharge switch serially connected thereto.

In yet a further separate aspect of the present invention, the thyristor DC switch is a one-way thyristor DC switch or a bidirectional thyristor switch.

The operation method of the rapid cutoff device for SCR DC switches in accordance with another aspect of the present invention includes:

connecting a bidirectional thyristor switch between a first DC circuit and a second DC circuit;

serially connecting a first switch with a first capacitor, and further parallel-connecting the first switch and the first capacitor with the first DC circuit;

serially connecting a second switch with the second capacitor, and further parallel-connecting the second switch and the second capacitor with the second DC circuit;

conducting a first direction of the bidirectional thyristor switch to supply first DC power of the first DC circuit to the second DC circuit via the bidirectional thyristor switch;

alternatively conducting a second direction of the bidirectional thyristor switch to supply second DC power of the second DC circuit to the first DC circuit via the bidirectional thyristor switch;

wherein when a first drive signal of the bidirectional thyristor switch stops, the first switch is operated to conduct the first capacitor and the first capacitor is charged by the first DC circuit which cannot supply the first DC power to the second DC circuit via the bidirectional thyristor switch to rapidly lower a first current of the bidirectional thyristor switch for approaching a zero value, thereby rapidly cutting off the bidirectional thyristor switch;

or, wherein when a second drive signal of the bidirectional thyristor switch stops, the second switch is operated to conduct the second capacitor and the second capacitor is charged by the second DC circuit which cannot supply the second DC power to the first DC circuit via the bidirectional thyristor switch to rapidly lower a second current of the bidirectional thyristor switch for approaching a zero value, thereby rapidly cutting off the bidirectional thyristor switch.

In a separate aspect of the present invention, the bidirectional thyristor switch further includes a first reversely-connected diode parallel-connected between the second DC circuit and the bidirectional thyristor switch.

In a further separate aspect of the present invention, the bidirectional thyristor switch further includes a second reversely-connected diode parallel-connected between the first DC circuit and the bidirectional thyristor switch.

In yet a further separate aspect of the present invention, the first capacitor parallel-connects with a first discharge circuit including a first resistor and a first discharge switch serially connected thereto.

In yet a further separate aspect of the present invention, the second capacitor parallel-connects with a second discharge circuit including a second resistor and a second discharge switch serially connected thereto.

In yet a further separate aspect of the present invention, the bidirectional thyristor switch further includes a mechanical switch parallel-connected therewith to form a hybrid switch.

In yet a further separate aspect of the present invention, a mechanical switch connects between the bidirectional thyristor switch and the second DC circuit to form an isolation switch.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

It is noted that a rapid cutoff device and operation method for SCR DC switches in accordance with the preferred embodiment of the present invention can be applicable to various DC switches, including one-way thyristor DC switches, bidirectional thyristor DC switches, isolation bidirectional thyristor DC switches or other DC switches, for example, which are not limitative of the present invention. Additionally, the rapid cutoff device and operation method for SCR DC switches of the preferred embodiment of the present invention is suitable for various DC power source systems, including solar power systems, wind power systems, wave energy power generation systems or other stand-alone power generation systems, for example, which are not limitative of the present invention.

Figure 1:
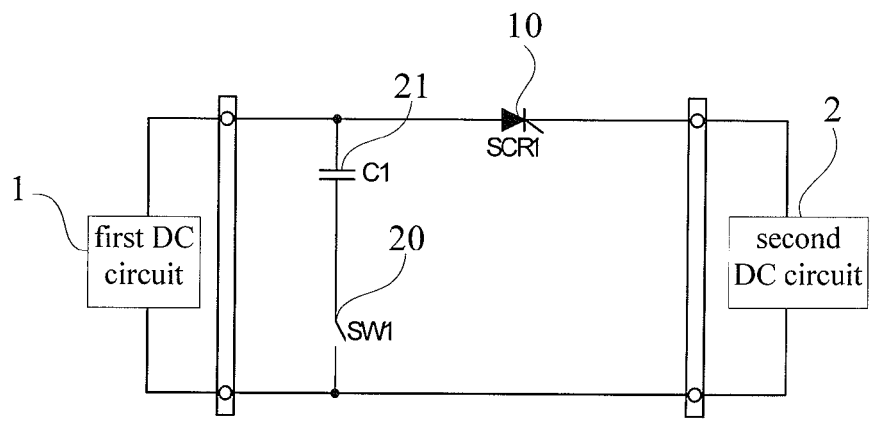
FIG. 1 is a schematic view of a rapid cutoff device for SCR DC switches in accordance with a first preferred embodiment of the present invention.

FIG. 1 shows a schematic view of a rapid cutoff device for SCR DC switches in accordance with a first preferred embodiment of the present invention. Referring now to FIG. 1, the rapid cutoff device for the SCR DC switches of the first preferred embodiment includes a thyristor DC switch 10, a switch 20 and a capacitor 21. The rapid cutoff device connects between a first DC circuit 1 and a second DC circuit 2. By way of example, the first DC circuit 1 is selected from an energy storage system (ESS), a stand-alone power generation system, an AC-DC converter, a DC-DC converter or a uninterruptible power supply (UPS).

Still referring to FIG. 1, by way of example, the thyristor DC switch 10 correspondingly connects between the first DC circuit 1 (corresponding to first DC circuit end of thyristor DC switch) and the second DC circuit 2 (corresponding to second DC circuit end) and is a thyristor switch. The thyristor DC switch 10 electrically connects with the first DC circuit 1 to supply DC power to the second DC circuit 2 while switching on the thyristor DC switch 10. The second DC circuit 2 is capable of utilizing or storing (absorbing) the DC power and is selected from an energy storage system, a DC-DC converter, an AC-DC converter or a DC load. Furthermore, the capacitor 21 serially connects with the switch 20 for controlling the operation of the capacitor 21, and the switch 20 and the capacitor 21 further parallel-connects with the first DC circuit 1.

With continued reference to FIG. 1, when the second DC circuit 2 requires cutting off the DC power supplied from the first DC circuit 1, a drive signal of the thyristor DC switch 10 stops and afterward the switch 20 is operated to conduct the capacitor 21. When the switch 20 is turned on, an initial voltage of the capacitor 21 is 0V and the first DC circuit 1 starts charging the capacitor 21. However, there exists a positive voltage on the second DC circuit 2 and accordingly a voltage difference between two ends of the thyristor DC switch 10 is instantly changed to a reverse voltage as well as a negative voltage. At the same time, a current of the thyristor DC switch 10 rapidly drops and approaches to a zero value. In this circumstance, the first DC circuit 1 cannot further supply the DC power to the second DC circuit 2 via the thyristor DC switch 10, thereby rapidly cutting off the thyristor DC switch 10. Subsequently, the switch 20 is turned off when the current of the thyristor DC switch 10 completely cuts off. In addition, the voltage of the capacitor 21 approaches to that of the first DC circuit 1.

Figure 2:
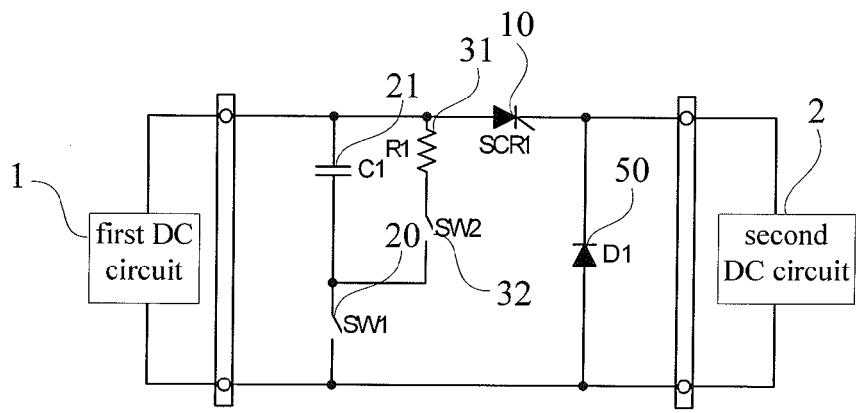
FIG. 2 is a schematic view of a rapid cutoff device for SCR DC switches in accordance with a second preferred embodiment of the present invention.

FIG. 2 shows a schematic view, similar to FIG. 1, of the rapid cutoff device for the SCR DC switches in accordance with a second preferred embodiment of the present invention. Referring to FIG. 2, compared with the first embodiment, the rapid cutoff device of the second preferred embodiment includes a thyristor DC switch 10, a switch 20, a capacitor 21, a resistor 31, a discharge switch 32 and a reversely-connected diode 50. By way of example, the resistor 31 and the discharge switch 32 are serially connected or are selectively connected by other connection manners to form a discharge circuit. A serially-connected circuit of the resistor 31 and the discharge switch 32 further parallel-connects with two ends of the capacitor 21. In a preferred embodiment, the two ends of the capacitor 21 are selectively connected with the serially-connected circuit of the resistor 31 and the discharge switch 32 by other connection manners.

Still referring to FIG. 2, the thyristor DC switch 10 electrically connects with the first DC circuit 1 to supply DC power to the second DC circuit 2 while switching on the thyristor DC switch 10. In the first embodiment, the resistor 31 serially connects with the discharge switch 32 and the discharge circuit of the resistor 31 and the discharge switch 32 parallel-connects with the capacitor 21.

With continued reference to FIG. 2, when the second DC circuit 2 requires cutting off the DC power supplied from the first DC circuit 1, a drive signal of the thyristor DC switch 10 stops and afterward the switch 20 is operated to conduct the capacitor 21. When the switch 20 is turned on, the initial voltage of the capacitor 21 is 0V and the first DC circuit 1 starts charging the capacitor 21. However, there exists a positive voltage on the second DC circuit 2 and accordingly a voltage difference between two ends of the thyristor DC switch 10 is instantly changed to a reverse voltage as well as a negative voltage. At the same time, the current of the thyristor DC switch 10 rapidly drops and approaches to a zero value. In this circumstance, the first DC circuit 1 cannot further supply the DC power to the second DC circuit 2 via the thyristor DC switch 10, thereby rapidly cutting off the thyristor DC switch 10. Subsequently, the switch 20 is turned off when the current of the thyristor DC switch 10 completely cuts off. In addition, the voltage of the capacitor 21 approaches to that of the first DC circuit 1.

With continued reference to FIG. 2, after turning off the switch 20, the discharge circuit of the resistor 31 and the discharge switch 32 is actuated to discharge the capacitor 21 via the resistor 31. The discharge switch 32 is turned off when the capacitor 21 is completely discharged to maintain an initial voltage with 0V for preparing the next rapidly cut-off operation of the thyristor DC switch 10.

With continued reference to FIG. 2, because the parasitical inductance existed in the circuits of the thyristor DC switch 10, the second DC circuit end of the thyristor DC switch 10 parallel-connects with the reversely-connected diode 50. When the thyristor DC switch 10 rapidly cuts off, at the same instant a current of the parasitical inductance can pass through the reversely-connected diode 50 such that the reversely-connected diode 50 and the second DC circuit 2 are formed as a loop. Advantageously, it can avoid the occurrence of induced high voltage which causes damages at the two ends of the thyristor DC switch 10. Furthermore, the arrangement of the reversely-connected diode 50 can speed up the operation of cutting off the thyristor DC switch 10. In a preferred embodiment, the reversely-connected diode 50 further includes a capacitor and a resistor parallel-connected thereto and a parallel-connected circuit of the capacitor and the resistor serially connects with the reversely-connected diode 50.

Figure 3:
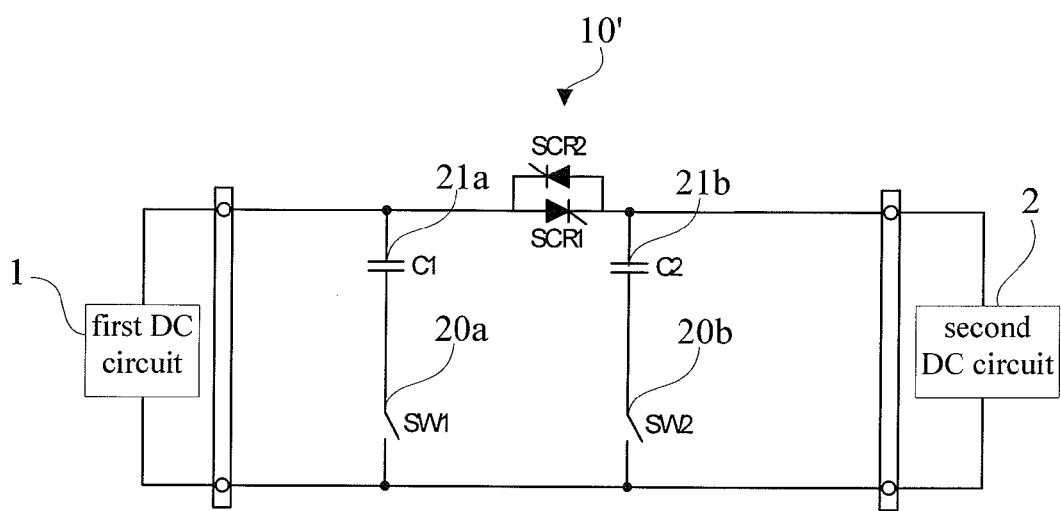
FIG. 3 is a schematic view of a rapid cutoff device for SCR DC switches in accordance with a third preferred embodiment of the present invention.

FIG. 3 shows a schematic view, similar to FIG. 1, of a rapid cutoff device for SCR DC switches in accordance with a third preferred embodiment of the present invention. Referring to FIG. 3, compared with the first embodiment, the rapid cutoff device of the third preferred embodiment includes a bidirectional thyristor switch 10', a first switch 20a, a second switch 20b, a first capacitor 21a and a second capacitor 21b. The bidirectional thyristor switch 10' includes two thyristor switch elements reversely parallel-connected each other, thereby capable of conducting DC currents in bidirectional directions.

Still referring to FIG. 3, by way of example, the bidirectional thyristor switch 10' connects between a first DC circuit 1 and a second DC circuit 2 which are capable of supplying DC power, consuming DC power or storing (absorbing) DC power. In power supply operation, the first DC circuit 1 can selectively supply DC power to the second DC circuit 2, or alternatively the second DC circuit 2 can selectively supply DC power to the first DC circuit 1. Namely, provided between the first DC circuit 1 and the second DC circuit 2 is bidirectional power supply. When a first direction of the bidirectional thyristor switch 10' connects through, the first DC circuit 1 can supply DC power to the second DC circuit 2 via the bidirectional thyristor switch 10'. Alternatively, when a second direction of the bidirectional thyristor switch 10' connects through, the second DC circuit 2 can supply DC power to the first DC circuit 1 via the bidirectional thyristor switch 10'.

Turning now to the left side in FIG. 3, by way of example, the first switch 20a serially connects with the first capacitor 21a such that the first switch 20a controllably conducts the first capacitor 21a for rapidly cutting of the bidirectional thyristor switch 10' in the first direction.

Turning now to the right side in FIG. 3, by way of example, correspondingly, the second switch 20b serially connects with the second capacitor 21b such that the second switch 20b also controllably conducts the second capacitor 21b for rapidly cutting of the bidirectional thyristor switch 10' in the second direction.

Still referring to FIG. 3, when the first direction of the bidirectional thyristor switch 10' connects through, the first DC circuit 1 can supply DC power to the second DC circuit 2 via the bidirectional thyristor switch 10'. When the bidirectional thyristor switch 10' cuts off to terminate power supply in the first direction, a first drive signal of the bidirectional thyristor switch 10' stops. While the first drive signal of the bidirectional thyristor switch 10' stops, the first switch 20a is operated to conduct the first capacitor 21a. At that instant an initial voltage of the first capacitor 21a is 0V and the first DC circuit 1 starts charging the first capacitor 21a. However, there exists a positive voltage on the second DC circuit 2 and accordingly a voltage difference between two ends of the bidirectional thyristor switch 10' is instantly changed to a reverse voltage as well as a negative voltage. At the same time, a current of the bidirectional thyristor switch 10' rapidly drops and approaches to a zero value, thereby rapidly cutting off the bidirectional thyristor switch 10'. Subsequently, the first switch 20a is turned off when the current of the bidirectional thyristor switch 10' completely cuts off. In addition, the voltage of the first capacitor 21a approaches to that of the first DC circuit 1.

With continued reference to FIG. 3, conversely, when the second direction of the bidirectional thyristor switch 10' connects through, the second DC circuit 2 can supply DC power to the first DC circuit 1 via the bidirectional thyristor switch 10'. When the bidirectional thyristor switch 10' cuts off to terminate power supply in the second direction, a second drive signal of the bidirectional thyristor switch 10' stops. While the second drive signal of the bidirectional thyristor switch 10' stops, the second switch 20b is operated to conduct the second capacitor 21b. At that instant an initial voltage of the second capacitor 21b is 0V and the second DC circuit 2 starts charging the second capacitor 21b. However, there also exists a positive voltage on the first DC circuit 1 and accordingly a voltage difference between two ends of the bidirectional thyristor switch 10' is instantly changed to a reverse voltage as well as a negative voltage. At the same time, a current of the bidirectional thyristor switch 10' rapidly drops and approaches to a zero value, thereby rapidly cutting off the bidirectional thyristor switch 10'. Subsequently, the second switch 20b is turned off when the current of the bidirectional thyristor switch 10' completely cuts off. In addition, the voltage of the second capacitor 21b approaches to that of the second DC circuit 2.

Figure 4:
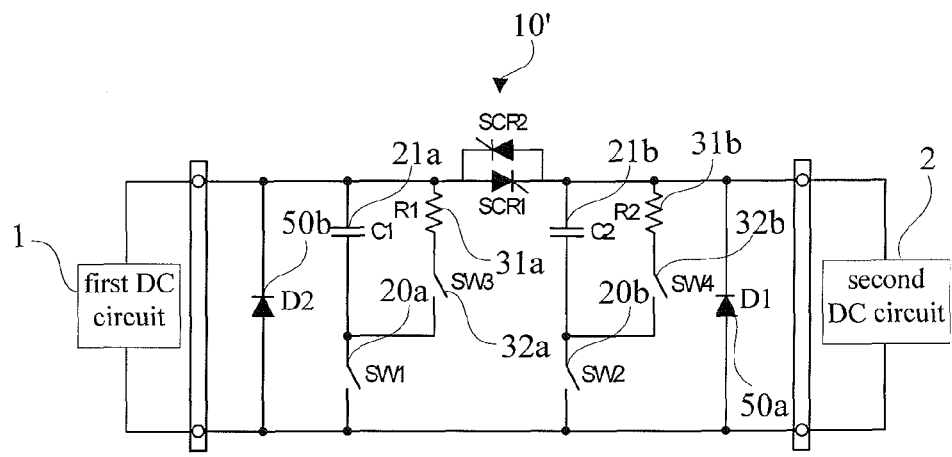
FIG. 4 is a schematic view of a rapid cutoff device for SCR DC switches in accordance with a fourth preferred embodiment of the present invention.

FIG. 4 shows a schematic view, similar to FIG. 3, of a rapid cutoff device for SCR DC switches in accordance with a fourth preferred embodiment of the present invention. Referring to FIG. 4, compared with the third embodiment, the rapid cutoff device of the fourth preferred embodiment includes a bidirectional thyristor switch 10', a first switch 20a, a second switch 20b, a first capacitor 21a, a second capacitor 21b, a first resistor 31a, a second resistor 31b, a first discharge switch 32a, a second discharge switch. 32b, a first reversely-connected diode 50a and a second reversely-connected diode 50b. The bidirectional thyristor switch 10' is a bidirectional thyristor switch or includes two thyristor switch elements reversely parallel-connected each other, thereby capable of conducting DC currents in bidirectional directions.

Still referring to FIG. 4, by way of example, the bidirectional thyristor switch 10' connects between a first DC circuit 1 and a second DC circuit 2 which are capable of supplying DC power, consuming DC power or storing (absorbing) DC power. In power supply operation, the first DC circuit 1 can selectively supply DC power to the second DC circuit 2, or alternatively the second DC circuit 2 can selectively supply DC power to the first DC circuit 1. Namely, provided between the first DC circuit 1 and the second DC circuit 2 is bidirectional power supply. When a first direction of the bidirectional thyristor switch 10' connects through, the first DC circuit 1 can supply DC power to the second DC circuit 2 via the bidirectional thyristor switch 10'. Alternatively, when a second direction of the bidirectional thyristor switch 10' connects through, the second DC circuit 2 can supply DC power to the first DC circuit 1 via the bidirectional thyristor switch 10'.

With continued reference to FIG. 4, by way of example, the first resistor 31a and the first discharge switch 32a are serially connected or are selectively connected by other connection manners to form a discharge circuit. A serially-connected circuit of the first resistor 31a and the first discharge switch 32a further parallel-connects with two ends of the first capacitor 21a. In a preferred embodiment, the two ends of the first capacitor 21a are selectively connected with the serially-connected circuit of the first resistor 31a and the first discharge switch 32a by other connection manners. Correspondingly, the second resistor 31b and the second discharge switch 32b are serially connected or are selectively connected by other connection manners to form a discharge circuit. A serially-connected circuit of the second resistor 31b and the second discharge switch 32b further parallel-connects with two ends of the second capacitor 21b. In a preferred embodiment, the two ends of the second capacitor 21b are selectively connected with the serially-connected circuit of the second resistor 31b and the second discharge switch 32b by other connection manners.

With continued reference to FIG. 4, when the first direction of the bidirectional thyristor switch 10' connects through, the first DC circuit 1 can supply DC power to the second DC circuit 2 via the bidirectional thyristor switch 10'. When the bidirectional thyristor switch 10' cuts off to terminate power supply in the first direction, a first drive signal of the bidirectional thyristor switch 10' stops. While the first drive signal of the bidirectional thyristor switch 10' stops, the first switch 20.a is operated to conduct the first capacitor 21a. At that instant an initial voltage of the first capacitor 21a is 0V and the first DC circuit 1 starts charging the first capacitor 21a. However, there exists a positive voltage on the second DC circuit 2 and accordingly a voltage difference between two ends of the bidirectional thyristor switch 10' is instantly changed to a reverse voltage as well as a negative voltage. At the same time, a current of the bidirectional thyristor switch 10' rapidly drops and approaches to a zero value, thereby rapidly cutting off the bidirectional thyristor switch 10'. Subsequently, the first switch 20a is turned off when the current of the bidirectional thyristor switch 10' completely cuts off. In addition, the voltage of the first capacitor 21a approaches to that of the first DC circuit 1.

With continued reference to FIG. 4, after turning off the first switch 20a, the discharge circuit of the first resistor 31a and the first discharge switch 32a is actuated to discharge the first capacitor 21a via the first resistor 31a. The first discharge switch 32a is turned off when the first capacitor 21a is completely discharged to maintain an initial voltage with 0V for preparing the next rapidly cut-off operation of the bidirectional thyristor switch 10'.

With continued reference to FIG. 4, conversely, when the second direction of the bidirectional thyristor switch 10' connects through, the second DC circuit 2 can supply DC power to the first DC circuit 1 via the bidirectional thyristor switch 10'. When the bidirectional thyristor switch 10' cuts off to terminate power supply in the second direction, a second drive signal of the bidirectional thyristor switch 10' stops. While the second drive signal of the bidirectional thyristor switch 10' stops, the second switch 20b is operated to conduct the second capacitor 21b. At that instant an initial voltage of the second capacitor 21b is 0V and the second DC circuit 2 starts charging the second capacitor 21b. However, there also exists a positive voltage on the first DC circuit 1 and accordingly a voltage difference between two ends of the bidirectional thyristor switch 10' is instantly changed to a reverse voltage as well as a negative voltage. At the same time, a current of the bidirectional thyristor switch 10' rapidly drops and approaches to a zero value, thereby rapidly cutting off the bidirectional thyristor switch 10'. Subsequently, the second switch 20b is turned off when the current of the bidirectional thyristor switch 10' completely cuts off. In addition, the voltage of the second capacitor 21b approaches to that of the second DC circuit 2.

With continued reference to FIG. 4, after turning off the second switch 20b, the discharge circuit of the second resistor 31b and the second discharge switch 32b is actuated to discharge the second capacitor 21b via the second resistor 31b. The second discharge switch 32b is turned off when the second capacitor 21b is completely discharged to maintain an initial voltage with 0V for preparing the next rapidly cut-off operation of the bidirectional thyristor switch 10'.

With continued reference to FIG. 4, because the parasitical inductance in the circuits of the bidirectional thyristor switch 10', the first reversely-connected diode 50a parallel-connects between the bidirectional thyristor switch 10' and the second DC circuit 2 and correspondingly the second reversely-connected diode 50b further parallel-connects between the bidirectional thyristor switch 10' and the first DC circuit 1. When the bidirectional thyristor switch 10' rapidly cuts off in the first direction, at the same instant a current of the parasitical inductance can pass through the first reversely-connected diode 50a such that the first reversely-connected diode 50a and the second DC circuit 2 are formed as a loop. Advantageously, it can avoid the occurrence of induced high voltage which causes damages at the two ends of the bidirectional thyristor switch 10' and can speed up the operation of cutting off the bidirectional thyristor switch 10'. Furthermore, when the bidirectional thyristor switch 10' rapidly cuts off in the second direction, at the same instant a current of the parasitical inductance can pass through the second reversely-connected diode 50b such that the second reversely-connected diode 50b and the first DC circuit 1 are formed as a loop. Advantageously, it can avoid the occurrence of induced high voltage which causes damages at the two ends of the bidirectional thyristor switch 10' and can speed up the operation of cutting off the bidirectional thyristor switch 10'. In a preferred embodiment, the first reversely-connected diode 50a or the second reversely-connected diode 50b further includes a capacitor and a resistor parallel-connected thereto and a parallel-connected circuit of the capacitor and the resistor serially connects with the first reversely-connected diode 50a or the second reversely-connected diode 50b.

Figure 5:
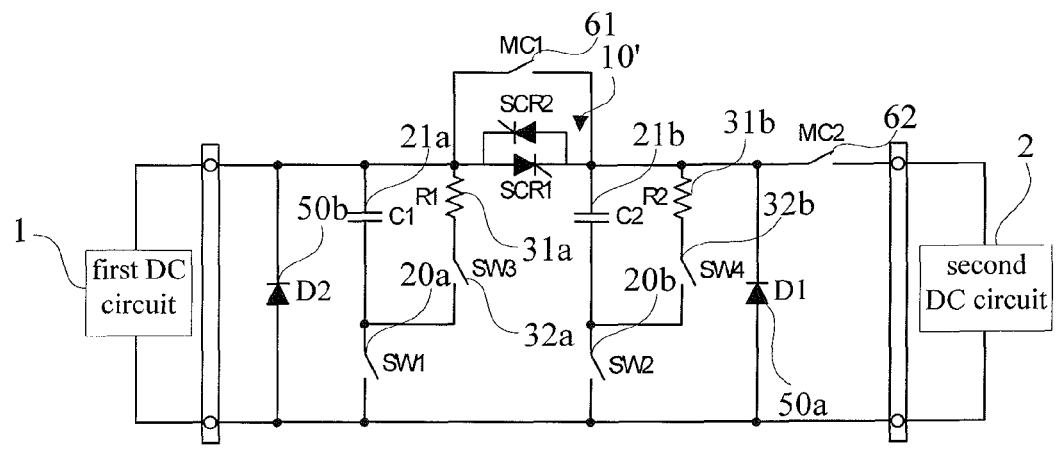
FIG. 5 is a schematic view of a rapid cutoff device for SCR DC switches in accordance with a fifth preferred embodiment of the present invention.

FIG. 5 is a schematic view, similar to FIG. 4, of a rapid cutoff device for SCR DC switches in accordance with a fifth preferred embodiment of the present invention. Referring now to FIG. 5, compared with the fourth embodiment, the rapid cutoff device of the fifth preferred embodiment includes a bidirectional thyristor switch 10', a first switch 20a, a second switch 20b, a first capacitor 21a, a second capacitor 21b, a first resistor 31a, a second resistor 31b, a first discharge switch 32a, a second discharge switch 32b, a first reversely-connected diode 50a, a second reversely-connected diode 50b, a first mechanical switch 61 and a second mechanical switch 62. The bidirectional thyristor switch 10' parallel-connects with the first mechanical switch 61 to form a hybrid switch and serially connects with the second mechanical switch 62 to form an isolation switch.

Figure 6:
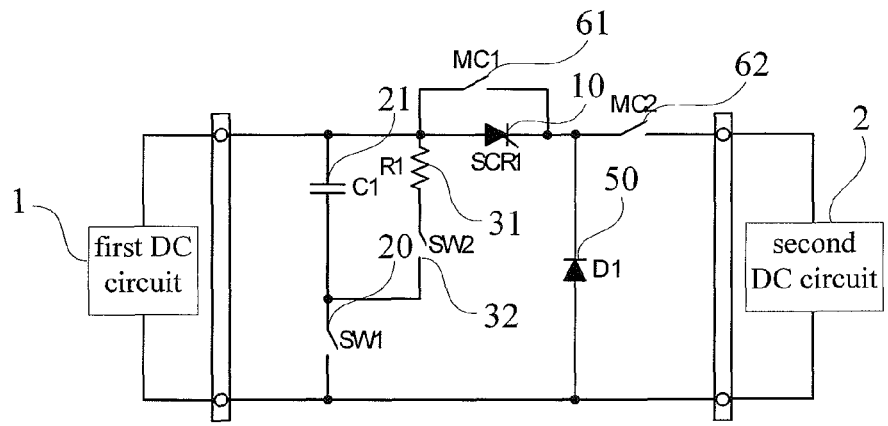
FIG. 6 is a schematic view of a rapid cutoff device for SCR DC switches in accordance with a sixth preferred embodiment of the present invention.

FIG. 6 is a schematic view, similar to FIG. 2, of a rapid cutoff device for SCR DC switches in accordance with a sixth preferred embodiment of the present invention. Referring to FIG. 6, compared with the second embodiment, the rapid cutoff device of the sixth preferred embodiment includes a thyristor DC switch 10, a switch 20, a capacitor 21, a resistor 31, a discharge switch 32, a reversely-connected diode 50, a first mechanical switch 61 and a second mechanical switch 62. The bidirectional thyristor switch 10' parallel-connects with the first mechanical switch 61 to form a hybrid switch and serially connects with the second mechanical switch 62 to form an isolation switch.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A rapid cutoff device for SCR DC switches comprising:
   a thyristor DC switch connected between a first DC circuit and a second DC circuit, with conducting the thyristor DC switch to supply DC power via the thyristor DC switch;
   a switch; and
   a capacitor serially connected with the switch, with the switch and the capacitor parallel-connected with the first DC circuit;
   wherein when a drive signal of the thyristor DC switch stops, the switch is operated to conduct the capacitor and the capacitor is charged by the first DC circuit which cannot supply the DC power via the thyristor DC switch to rapidly lower a current of the thyristor DC switch for approaching a zero value, thereby rapidly cutting off the thyristor DC switch.

2. The rapid cutoff device for the SCR DC switches as defined in claim 1, wherein the thyristor DC switch has a second DC circuit end parallel-connected to a reversely-connected diode.

3. The rapid cutoff device for the SCR DC switches as defined in claim 1, further including a resistor and a switch, wherein the resistor and the switch comprises a discharge circuit which parallel connects with the capacitor.

4. The rapid cutoff device for the SCR DC switches as defined in claim 1, wherein a mechanical switch parallel-connects with the thyristor DC switch to form a hybrid switch.

5. The rapid cutoff device for the SCR DC switches as defined in claim 1, wherein a mechanical switch serially connects with the thyristor DC switch to form an isolation switch.

6. A rapid cutoff device for SCR DC switches comprising:
   a bidirectional thyristor switch connected between a first DC circuit and a second DC circuit, with conducting a first direction of the bidirectional thyristor switch to supply first DC power of the first DC circuit to the second DC circuit via the bidirectional thyristor switch, with alternatively conducting a second direction of the bidirectional thyristor switch to supply second DC power of the second DC circuit to the first DC circuit via the bidirectional thyristor switch;
   a first switch;
   a first capacitor serially connected with the first switch, with the first switch and the first capacitor connected between the first DC circuit and the bidirectional thyristor switch;
   a second switch; and
   a second capacitor serially connected with the second switch, with the second switch and the second capacitor connected between the second DC circuit and the bidirectional thyristor switch;
   wherein when a first drive signal of the bidirectional thyristor switch stops, the first switch is operated to conduct the first capacitor and the first capacitor is charged by the first DC circuit to rapidly lower a first current of the bidirectional thyristor switch for approaching a zero value, thereby rapidly cutting off the bidirectional thyristor switch;
   or, wherein when a second drive signal of the bidirectional thyristor switch stops, the second switch is operated to conduct the second capacitor and the second capacitor is charged by the second DC circuit to rapidly lower a second current of the bidirectional thyristor switch for approaching a zero value, thereby rapidly cutting off the bidirectional thyristor switch.

7. The rapid cutoff device for the SCR DC switches as defined in claim 6, wherein the bidirectional thyristor switch further includes a first reversely-connected diode parallel-connected with the second DC circuit.

8. The rapid cutoff device for the SCR DC switches as defined in claim 6, wherein the bidirectional thyristor switch further includes a second reversely-connected diode parallel-connected with the first DC circuit.

9. The rapid cutoff device for the SCR DC switches as defined in claim 6, wherein the first capacitor parallel-connects with a first discharge circuit including a first resistor and a first discharge switch serially connected thereto.

10. The rapid cutoff device for the SCR DC switches as defined in claim 6, wherein the second capacitor parallel-connects with a second discharge circuit including a second resistor and a second discharge switch serially connected thereto.

11. The rapid cutoff device for the SCR DC switches as defined in claim 6, wherein the bidirectional thyristor switch further includes a mechanical switch parallel-connected therewith to form a hybrid switch.

12. The rapid cutoff device for the SCR DC switches as defined in claim 6, wherein the bidirectional thyristor switch further includes a mechanical switch serially connected therewith to form an isolation switch.

13. An operation method of a rapid cutoff device for SCR DC switches comprising:
   connecting a thyristor DC switch between a first DC circuit and a second DC circuit;
   serially connecting a switch with a capacitor, and further parallel-connecting the switch and the capacitor with the first DC circuit;
   supplying DC power of the first DC circuit via the thyristor DC switch while switching on the thyristor DC switch;
   wherein when a drive signal of the thyristor DC switch stops, the switch is operated to conduct the capacitor and the capacitor is charged by the first DC circuit which cannot supply the DC power via the thyristor DC switch to rapidly lower a current of the thyristor DC switch for approaching a zero value, thereby rapidly cutting off the thyristor DC switch.

14. The operation method of the rapid cutoff device as defined in claim 13, wherein the thyristor DC switch has a second DC circuit end parallel-connected to a reversely-connected diode.

15. The operation method of the rapid cutoff device as defined in claim 13, wherein the capacitor further includes a discharge circuit including a resistor and a discharge switch serially connected thereto.

16. The operation method of the rapid cutoff device as defined in claim 13, wherein the thyristor DC switch further includes a mechanical switch parallel-connected therewith to form a hybrid switch.

17. The operation method of the rapid cutoff device as defined in claim 13, wherein the thyristor DC switch further includes a mechanical switch serially connected therewith to form an isolation switch.

18. An operation method of a rapid cutoff device for SCR DC switches comprising:
   connecting a bidirectional thyristor switch between a first DC circuit and a second DC circuit;
   serially connecting a first switch with a first capacitor, and further connecting the first switch and the first capacitor between the first DC circuit and the bidirectional thyristor switch;
   serially connecting a second switch with a second capacitor, and further connecting the second switch and the second capacitor between the second DC circuit and the bidirectional thyristor switch;
   conducting a first direction of the bidirectional thyristor switch to supply first DC power of the first DC circuit to the second DC circuit via the bidirectional thyristor switch;
   alternatively conducting a second direction of the bidirectional thyristor switch to supply second DC power of the second DC circuit to the first DC circuit via the bidirectional thyristor switch;
   wherein when a first drive signal of the bidirectional thyristor switch stops, the first switch is operated to conduct the first capacitor and the first capacitor is charged by the first DC circuit which cannot supply the first DC power to the second DC circuit via the bidirectional thyristor switch to rapidly lower a first current of the bidirectional thyristor switch for approaching a zero value, thereby rapidly cutting off the bidirectional thyristor switch;
   or, wherein when a second drive signal of the bidirectional thyristor switch stops, the second switch is operated to conduct the second capacitor and the second capacitor is charged by the second DC circuit which cannot supply the second DC power to the first DC circuit via the bidirectional thyristor switch to rapidly lower a second current of the bidirectional thyristor switch for approaching a zero value, thereby rapidly cutting off the bidirectional thyristor switch.

19. The operation method of the rapid cutoff device as defined in claim 18, wherein the bidirectional thyristor switch further includes a first reversely-connected diode parallel-connected between the second DC circuit and the bidirectional thyristor switch.

20. The operation method of the rapid cutoff device as defined in claim 18, wherein the bidirectional thyristor switch further includes a second reversely-connected diode parallel-connected between the first DC circuit and the bidirectional thyristor switch.

21. The operation method of the rapid cutoff device as defined in claim 18, wherein the first capacitor parallel-connects with a first discharge circuit including a first resistor and a first discharge switch serially connected thereto.

22. The operation method of the rapid cutoff device as defined in claim 18, wherein the second capacitor parallel-connects with a second discharge circuit including a second resistor and a second discharge switch serially connected thereto.

23. The operation method of the rapid cutoff device as defined in claim 18, wherein the bidirectional thyristor switch further includes a mechanical switch parallel-connected therewith to form a hybrid switch.

24. The operation method of the rapid cutoff device as defined in claim 18, wherein the bidirectional thyristor switch further includes a mechanical switch serially connected therewith to form an isolation switch.

* * * * *